US009157603B2

(12) United States Patent
Liu et al.

(10) Patent No.: US 9,157,603 B2
(45) Date of Patent: Oct. 13, 2015

(54) LIGHT EMITTING UNIT WITH REFLECTOR FOR UNIFORM LIGHT EMISSION

(71) Applicants: Hung-Wei Liu, Hsin-Chu (TW); Fan-Ti Cho, Hsin-Chu (TW); Chin-Ku Liu, Hsin-Chu (TW)

(72) Inventors: Hung-Wei Liu, Hsin-Chu (TW); Fan-Ti Cho, Hsin-Chu (TW); Chin-Ku Liu, Hsin-Chu (TW)

(73) Assignee: Young Lighting Technology Inc., Hsin-Chu (TW)

( * ) Notice: Subject to any disclaimer, the term of this patent is extended or adjusted under 35 U.S.C. 154(b) by 31 days.

(21) Appl. No.: 14/089,764

(22) Filed: Nov. 26, 2013

(65) Prior Publication Data
US 2014/0160750 A1  Jun. 12, 2014

(30) Foreign Application Priority Data

Dec. 7, 2012  (CN) .......................... 2012 1 0528829

(51) Int. Cl.
| | |
|---|---|
| F21V 7/09 | (2006.01) |
| F21V 7/00 | (2006.01) |
| F21K 99/00 | (2010.01) |
| G02B 19/00 | (2006.01) |
| F21S 8/04 | (2006.01) |
| F21V 7/04 | (2006.01) |
| G02F 1/1335 | (2006.01) |

(Continued)

(52) U.S. Cl.
CPC . *F21V 7/005* (2013.01); *F21K 9/54* (2013.01); *F21S 8/04* (2013.01); *F21V 7/0008* (2013.01); *F21V 7/04* (2013.01); *F21V 7/09* (2013.01); *G02B 19/0019* (2013.01); *G02B 19/0066* (2013.01); *F21K 9/30* (2013.01); *F21Y 2101/02* (2013.01); *F21Y 2103/003* (2013.01); *G02F 1/133605* (2013.01); *H01L 25/075* (2013.01); *H01L 33/60* (2013.01)

(58) Field of Classification Search
CPC ....... F21K 9/54; F21V 7/0033; F21V 7/0041; F21V 7/005; F21V 7/09; F21V 7/0008; G02B 19/0066; G02B 19/0019; F21Y 2103/003; G02F 1/133605; G02F 1/133608; G02F 1/133611; G02F 1/133603
See application file for complete search history.

(56) References Cited

U.S. PATENT DOCUMENTS

| | | | | |
|---|---|---|---|---|
| 5,988,829 | A | * | 11/1999 | Holder .......................... 362/223 |
| 2004/0120160 | A1 | * | 6/2004 | Natsume ....................... 362/544 |

(Continued)

FOREIGN PATENT DOCUMENTS

| | | |
|---|---|---|
| CN | 2729530 | 9/2005 |
| CN | 201475729 | 5/2010 |

(Continued)

*Primary Examiner* — Anh Mai
*Assistant Examiner* — Steven Horikoshi
(74) *Attorney, Agent, or Firm* — Jianq Chyun IP Office

(57) ABSTRACT

A light emitting unit includes a light source device and a reflector. The light source device extends in parallel with an extension direction, and is capable of providing a light beam. The reflector is configured under the light source device and extends in parallel with the extension direction. The reflector has a first protrusion and a pair of second protrusions located on two sides of the first protrusion, the first protrusion has a peak portion and two trough portions, the second protrusion has a peak portion and a trough portion, and the two trough portions of the first protrusion are respectively connected to the trough portions of the two second protrusions to provide a fluctuant reflection surface, and a height of a cross section contour of the pair of the second protrusions in parallel with the extension direction is decreased from a center to two ends of the reflector.

16 Claims, 16 Drawing Sheets

(51) Int. Cl.
  *H01L 25/075* (2006.01)
  *H01L 33/60* (2010.01)
  *F21Y 101/02* (2006.01)
  *F21Y 103/00* (2006.01)

(56) References Cited

U.S. PATENT DOCUMENTS

| | | |
|---|---|---|
| 2005/0243578 A1 | 11/2005 | Lee et al. |
| 2010/0046230 A1* | 2/2010 | Ding et al. ............ 362/294 |
| 2010/0327768 A1* | 12/2010 | Kong et al. ............ 315/294 |
| 2011/0149194 A1* | 6/2011 | Nakano ............ 349/58 |
| 2011/0273871 A1* | 11/2011 | Fukui ............ 362/218 |
| 2013/0208457 A1* | 8/2013 | Durkee et al. ............ 362/218 |

FOREIGN PATENT DOCUMENTS

| | | |
|---|---|---|
| CN | 101418929 | 4/2011 |
| TW | 526349 | 4/2003 |
| TW | 593926 | 6/2004 |
| TW | I265749 | 11/2006 |
| TW | 201007291 | 2/2010 |
| TW | I360695 | 3/2012 |

* cited by examiner

LIGHT EMITTING UNIT WITH REFLECTOR FOR UNIFORM LIGHT EMISSION

CROSS-REFERENCE TO RELATED APPLICATION

This application claims the priority benefit of China application serial no. 201210528829.X, filed on Dec. 7, 2012. The entirety of the above-mentioned patent application is hereby incorporated by reference herein and made a part of this specification.

BACKGROUND OF THE INVENTION

1. Field of the Invention

The invention generally relates to a light source device, in particular, to a light emitting unit.

2. Description of Related Art

Generally, a liquid crystal display, being a non-self-luminance display device, needs a backlight module providing uniform illumination. A light emitting diode (LED) is usually applied to, for example, a bottom type backlight module and an edge type backlight module, so as to achieve a backlight module being light, thin, and power saving. Currently, the bottom type backlight module has good light emitting uniformity and brilliance, thereby being usually used in various high order displays. In order to enable the light emission of the LEDs of a plurality of point light sources to be more uniform, usually a diffusion film layer is used to further diffuse the light beams emitted from the LEDs distributed in the backlight module, and a distance is maintained between the LEDs and the diffusion film layer for the diffusion of the light beams, that is, a so-called light cavity is formed. Alternatively, a secondary optical lens is utilized to further diffuse the light beams of the LEDs. However, when the light cavity is utilized to enable the light beams to be uniformly diffused, the volume of the backlight module may be excessively large, so that it is difficult to thin the display device. On the other hand, when the thickness of the light cavity is decreased, more LEDs are needed to be configured to prevent the backlight module from generating bright and dark fringes in which brightness and darkness exist at intervals. The configured secondary optical lens may increase the overall cost of the backlight module, and it is difficult to reduce the weight as well. Therefore, it is a problem still waited to be solved that how to compromise the light and thin volume, the light emitting uniformity, and the cost of the display device.

In ROC Patent Publication No. TWI265749, a backlight device is disclosed, tapered projections are formed on a position of a reflecting piece corresponding to an LED located thereabove, and the tapered projections may enable light beams directly emitted downwards by the LED to be guided along a transverse or horizontal direction. In ROC Patent Publication No. TWI360695, a bottom type backlight module is disclosed, a reflecting piece includes a plurality of first reflecting protrusions and a plurality of second reflecting protrusions, the first reflecting protrusions are located right under a line light source, and the first reflecting protrusions and the second reflecting protrusions are arranged at intervals and are in an elongated strip shape being parallel with one another. In ROC Patent Publication No. TW593926, it is disclosed that each reflecting unit of a reflecting plate further includes a protruding portion extending from a centre position of a middle face portion along a longitudinal direction of a corresponding line light source and protruding upwards. In ROC Patent Publication No. TW201007291, a backlight module is disclosed, a plurality of reflecting curved surfaces are formed on a bottom plate of a frame, light beam emitted from a spot light source towards the frame first reach the reflecting curved surfaces, are reflected by the reflecting curved surfaces to an optical plate above the spot light source for being emitted. In PRC Patent Publication No. CN201475729U, an LED light source beneficiating device is disclosed, two inclined planes being inclined outwards are disposed on a surface of a heat dissipation surface, the two inclined planes are symmetrically arranged as a V shape, and two LED modules having the same power are respectively assembled on the surfaces of the two inclined planes. In ROC Patent Publication No. TW526349, it is disclosed that protrusion shapes of a reflecting plate are continuous variations or discontinuous variations. In US Patent Publication No. US20050243578, it is disclosed that a curvature of a reflection surface of a reflecting piece is the same as that of a light conductive plate. In PRC Patent Publication No. CN101418929B, a widely uniform backlight device is disclosed. In PRC Patent Publication No. CN2729530Y, a shading plate having a non-transparent plate body provided with a reflecting surface is disclosed.

SUMMARY OF THE INVENTION

Accordingly, the invention is directed to a light emitting unit, used to provide a uniform light source.

Other objectives and advantages of the invention could be further understood from technological features disclosed in the invention.

In order to achieve at least one of objectives, an embodiment of the invention provides a light emitting unit, including a light source device and a reflector. The light source device extends in parallel with an extension direction, and is capable of providing a light beam. The reflector is configured under the light source device and extends in parallel with the extension direction. The reflector has a first protrusion and a pair of second protrusions located on two sides of the first protrusion, the first protrusion has a peak portion and two trough portions located on two sides of the peak portion, the second protrusion has a peak portion and a trough portion, and the two trough portions of the first protrusion are respectively connected to the trough portions of the two second protrusions to provide a fluctuant reflection surface. A height of a cross section contour of the pair of second protrusions in parallel with the extension direction is decreased from a centre to two ends of the reflector.

In an embodiment of the invention, decreasing degrees of the pair of second protrusions are the same.

In an embodiment of the invention, a height of the peak portion of the first protrusion in parallel with the extension direction is deceased from the centre to the two ends of the reflector.

In an embodiment of the invention, the light source device includes a heat dissipation column and a plurality of light emitting elements, the heat dissipation column extends along the extension direction, and the light emitting elements are configured on the heat dissipation column along the extension direction.

In an embodiment of the invention, the heat dissipation column is a polygonal column, and the light emitting elements are configured on a column surface of the polygonal column facing the reflector.

In an embodiment of the invention, the heat dissipation column is a polygonal column, and the light emitting elements are configured on two neighboring column surfaces of the polygonal column facing the reflector.

In an embodiment of the invention, an included angle of the two neighboring column surfaces is decreased in parallel with the extension direction from a centre to two ends of the polygonal column.

In an embodiment of the invention, the heat dissipation column is a quadrangular column with a kite cross section.

In an embodiment of the invention, the reflector further includes at least one supporting wall, and the supporting wall is connected to the peak portion of the second protrusion and forms two side boundaries of a cross section contour of the reflector vertical to the extension direction.

In an embodiment of the invention, the reflector further includes at least one hole located on the supporting wall and a fixing part, and the fixing part is configured in the hole.

In an embodiment of the invention, the reflection surface is formed by a plurality of plane surfaces connected to one another.

In an embodiment of the invention, the reflection surface is formed by a plurality of curved surfaces connected to one another.

In an embodiment of the invention, the light emitting unit further includes a module supporting frame and a fixing part, the reflector further includes an accommodation recess located on the supporting wall, the fixing part penetrates a perforation of the module supporting frame and the accommodation recess on the supporting wall, so as to fix the reflector in the module supporting frame.

In an embodiment of the invention, the light source device includes a heat dissipation column and a plurality of light emitting elements, the module supporting frame has a first side wall, a second side wall opposite to the first side wall, a third side wall, and a fourth side wall opposite to the third side wall, the first side wall and the second side wall are in parallel with the extension direction, the third side wall and the fourth side wall are vertical to the extension direction and respectively have a supporting portion, wherein the heat dissipation column is fixed on the two supporting portions and suspends on the reflector.

In an embodiment of the invention, the light source device includes a column and a plurality of light emitting elements, the column extends along the extension direction, the light emitting elements are configured on the peak portion of the first protrusion of the reflector along the extension direction, and the light emitting elements face a column surface of the column.

In an embodiment of the invention, the column is a polygonal column, and the light emitting elements face two neighboring column surfaces of the polygonal column.

Based on the above mentioned, a fluctuant reflection surface in an embodiment of the invention has a first protrusion and a pair of second protrusions located on two sides of the first protrusion, and a height of a cross section contour of the pair of second protrusions in parallel with the extension direction is decreased from center to two ends of a reflector, so that a light beam is enabled to be distributed from a non-edge zone to an edge zone of the light emitting unit, so as to balance light emitting intensities of a center (for example, the non-edge zone) and two ends (for example, the edge zones) of a light emitting zone of the light emitting unit. In addition, fluctuant variations of the cross section contour of the reflector vertical to the extension direction enable local light intensity to distribute uniformly, so as to improve an overall illumination quality of the light emitting unit. Therefore, an overall light emitting intensity of the light emitting unit is uniform, and an edge light emitting intensity of the light emitting unit is also uniform.

Other objectives, features and advantages of the present invention will be further understood from the further technological features disclosed by the embodiments of the present invention wherein there are shown and described preferred embodiments of this invention, simply by way of illustration of modes best suited to carry out the invention.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

In the following detailed description of the preferred embodiments, reference is made to the accompanying drawings which form a part hereof, and in which are shown by way of illustration specific embodiments in which the invention may be practiced. In this regard, directional terminology, such as "top," "bottom," "front," "back," etc., is used with reference to the orientation of the Figure(s) being described. The components of the present invention can be positioned in a number of different orientations. As such, the directional terminology is used for purposes of illustration and is in no way limiting. On the other hand, the drawings are only schematic and the sizes of components may be exaggerated for clarity. It is to be understood that other embodiments may be utilized and structural changes may be made without departing from the scope of the present invention. Also, it is to be understood that the phraseology and terminology used herein are for the purpose of description and should not be regarded as limiting. The use of "including," "comprising," or "having" and variations thereof herein is meant to encompass the items listed thereafter and equivalents thereof as well as additional items. Unless limited otherwise, the terms "connected," "coupled," and "mounted" and variations thereof herein are used broadly and encompass direct and indirect connections, couplings, and mountings. Similarly, the terms "facing," "faces" and variations thereof herein are used broadly and encompass direct and indirect facing, and "adjacent to" and variations thereof herein are used broadly and encompass directly and indirectly "adjacent to". Therefore, the description of "A" component facing "B" component herein may contain the situations that "A" component directly faces "B" component or one or more additional components are between "A" component and "B" component. Also, the description of "A" component "adjacent to" "B" component herein may contain the situations that "A" component is directly "adjacent to" "B" component or one or more additional components are between "A" component and "B" component. Accordingly, the drawings and descriptions will be regarded as illustrative in nature and not as restrictive.

Figure 1:
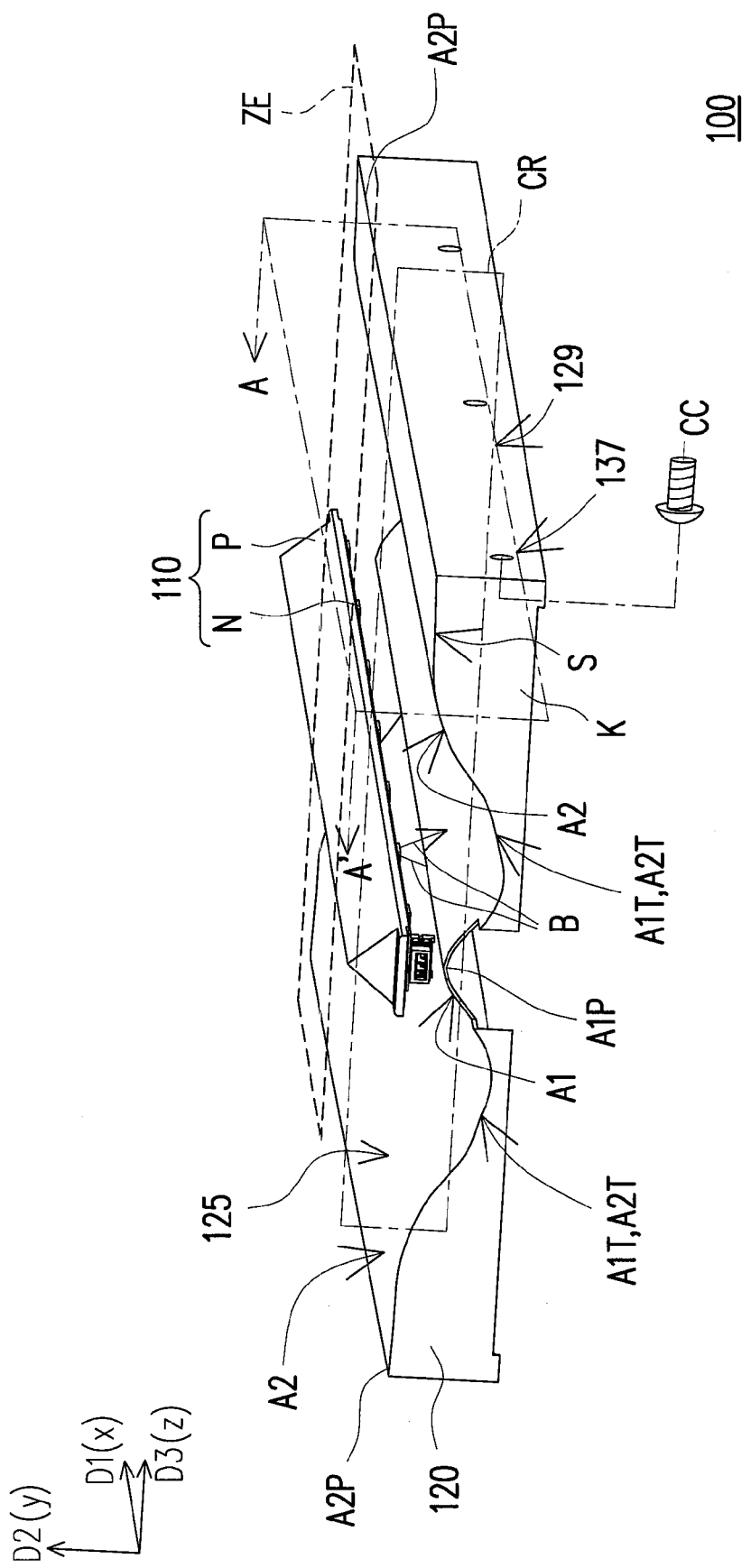
FIG. 1 is a schematic partial three-dimensional view of a light emitting unit in an embodiment of the invention.
Figure 2A:
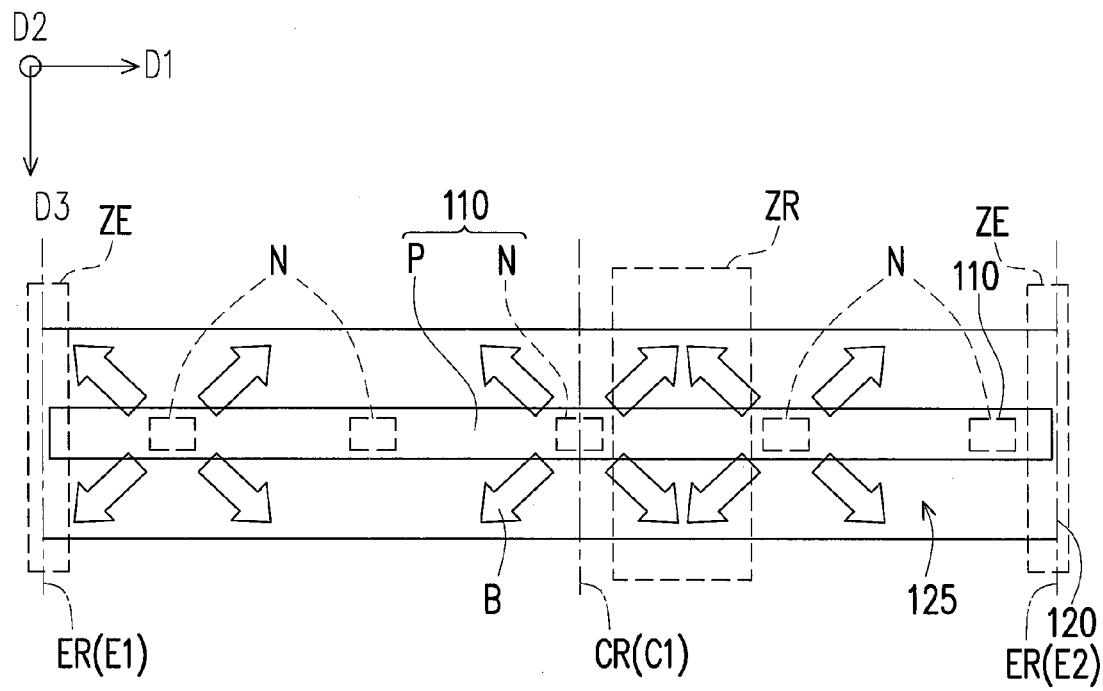
FIG. 2A is a schematic top view of the light emitting unit in the embodiment of FIG. 1.
Figure 2B:
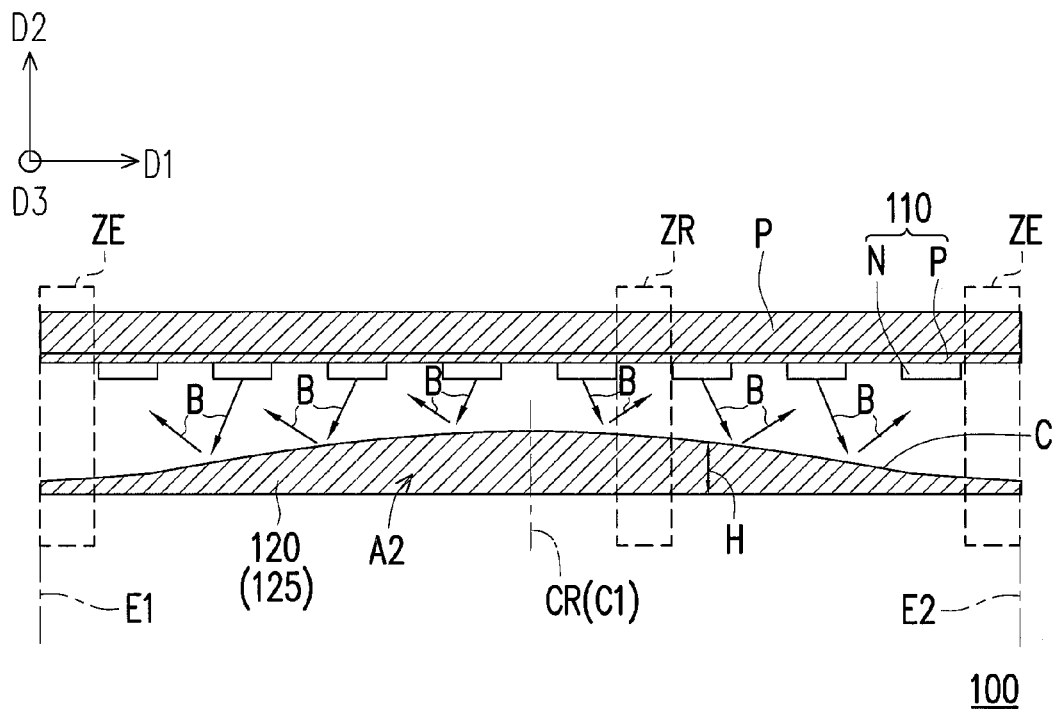
FIG. 2B is a schematic side view of the light emitting unit in the embodiment of FIG. 1.

FIG. 1 is a schematic partial three-dimensional view of a light emitting unit in an embodiment of the invention, FIG. 2A is a schematic top view of the light emitting unit in the embodiment of FIG. 1, and FIG. 2B is a schematic side view of the light emitting unit in the embodiment of FIG. 1 along an AA' line. Referring to FIG. 1 to FIG. 2B, in this embodiment, the light emitting unit 100 includes a light source device 110 and a reflector 120. The light source device 110 extends in parallel with an extension direction D1. The light source device 110 is capable of providing a light beam B. The reflector 120 is configured under the light source device 110 and extends in parallel with the extension direction D1. The reflector 120 has a first protrusion A1 and a pair of second protrusions A2 located on two sides of the first protrusion A1, the first protrusion A1 has a peak portion A1P and two trough portions A1T located on two sides of the peak portion A1P, the second protrusion A2 has a peak portion A2P and a trough portion A2T, and the two trough portions A1T of the first protrusion A1 are respectively connected to the trough portions A2T of the two second protrusions A2 to provide a fluctuant reflection surface 125. The light source device 110 is, for example, configured right above the first protrusion A1 of the reflector 120. A cross section contour C of the pair of second protrusions A2 in parallel with the extension direction D1 and located between the trough portion A2T and the peak portion A2P of the second protrusion A2 gradually changes from a centre C1 to two ends E1 and E2 of the reflector 120, as shown in FIG. 2B. In detail, a height H of the cross section contour C of the pair of second protrusions A2 in parallel with the extension direction D1 is decreased from the centre C1 to the two ends E1 and E2 of the reflector 120. The light beam B reflected by the centre C1 of the reflector 120 may be transmitted to the two ends E1 and E2 of the reflector 120. For example, in this embodiment, the extension direction D1 and directions D2 and D3 as shown in FIG. 1 may correspond to X axis, Y axis, and Z axis in a three dimensional coordinate, but the invention is not limited thereto. Further, in this embodiment, the number of the light emitting unit 100 is, for example, one, but in other embodiments, a plurality of the light emitting units 100 may also be arranged along another direction (for example, the direction D3) (as shown in FIG. 5E) to increase a uniform light emitting area, but the invention is not limited thereto. The light beam B reflected by the centre C1 of the reflector 120 may be transmitted to the two ends E1 and E2 of the reflector 120, so that the light beam B transmitted to the two ends E1 and E2 of the reflector 120 may be increased, brightness of the reflector 120 at an edge zone ZE (that is, brightness of a dark zone generated at the edge zone ZE of the light source device 110 is improved) is increased, so as to provide a more uniform light source.

Referring to FIG. 2A and FIG. 2B, for example, in this embodiment, the light source device 110 may include a heat dissipation column P and a plurality of the light emitting elements N. The heat dissipation column P is made of metal or an easily heat conductive material, and the light emitting element N may be an LED or other light sources suitable for light emitting, but the invention is not limited thereto. The heat dissipation column P extends along the extension direction D1, and the light emitting elements N are configured on the heat dissipation column P along the extension direction D1. Distribution positions of the light emitting elements N may be as shown in FIG. 2A and FIG. 2B, wherein the edge zones ZE locates on the two ends E1 and E2 of the reflector 120. Since that only one light emitting element N is provided for the light source, a light emitting intensity of the edge zone ZE is, under the situation of not adopting the embodiment of the invention, distinctly low and not uniform compared with a non-edge zone (for example, a zone ZR) having two light emitting elements N for the light source. As shown in FIG. 2B, in this embodiment, the height H of the cross section contour C is decreased from the centre C1 to the two ends E1 and E2 of the reflector 120, so that the light beam B is transmitted from the zone ZR to the edge zones ZE, so as to balance the light emitting intensities of the centre C1 (for example, the zone ZR) and the two ends E1 and E2 (for example, the edge zones ZE) of the light emitting zone of the light emitting unit 100. In addition, in another embodiment, a height of the peak portion A1P of the first protrusion A1 in parallel with the extension direction D1 may be also decreased from the centre C1 to the two ends E1 and E2 of the reflector 120, and a cross section contour is similar to the cross section contour C, so that the light beam B is distributed from the zone ZR to the edge zones ZE, so as to balance the light emitting intensities of the centre C1 (for example, the zone ZR) and the two ends E1 and E2 (for example, the edge zones ZE) of the light emitting zone of the light emitting unit 100.

In addition, in other embodiments, a fluctuant change of a cross section contour of the reflection surface 125 on a plane surface in parallel with the direction D2 and the direction D3 (for example, a centre reference cross section CR and planes in parallel with the centre reference cross section CR) may also gradually change from the centre C1 to the two ends E1 and E2 of the light emitting zone of the light emitting unit 100, such that a local light intensity is uniform, and the light intensity of the light emitting zone of the light emitting unit 100 further becomes average, thereby improving an overall illumination quality of the light emitting unit 100. For the detailed content and the embodiments, please refer to the description hereafter.

Figure 3A:
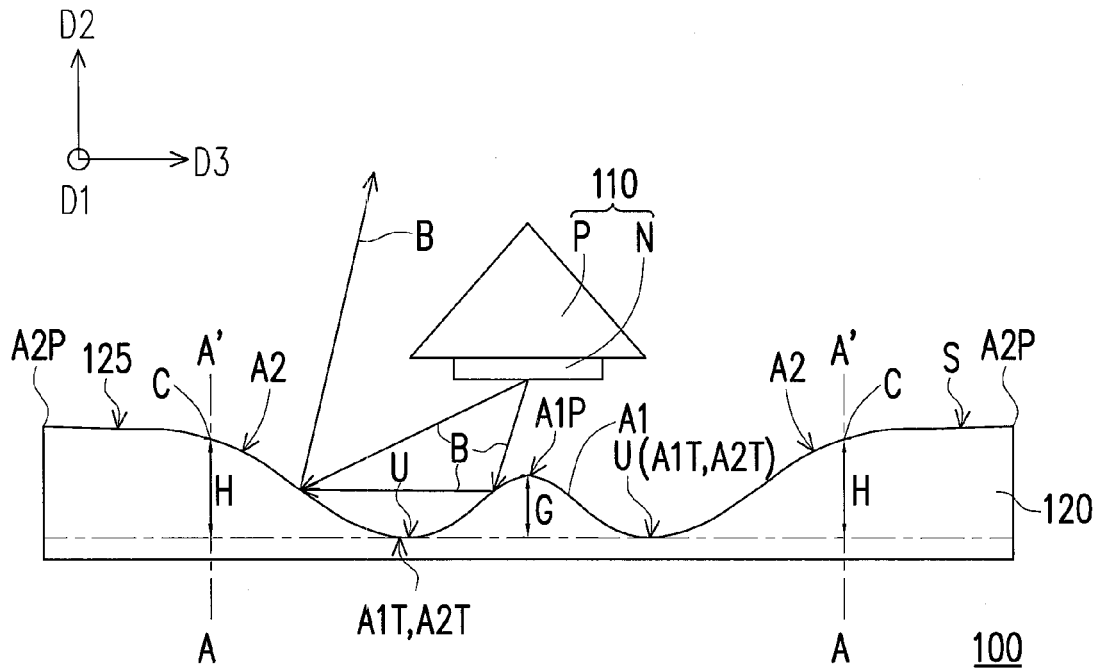
FIG. 3A is a cross-sectional view of a centre of the light emitting unit in the embodiment of FIG. 1.
Figure 3B:
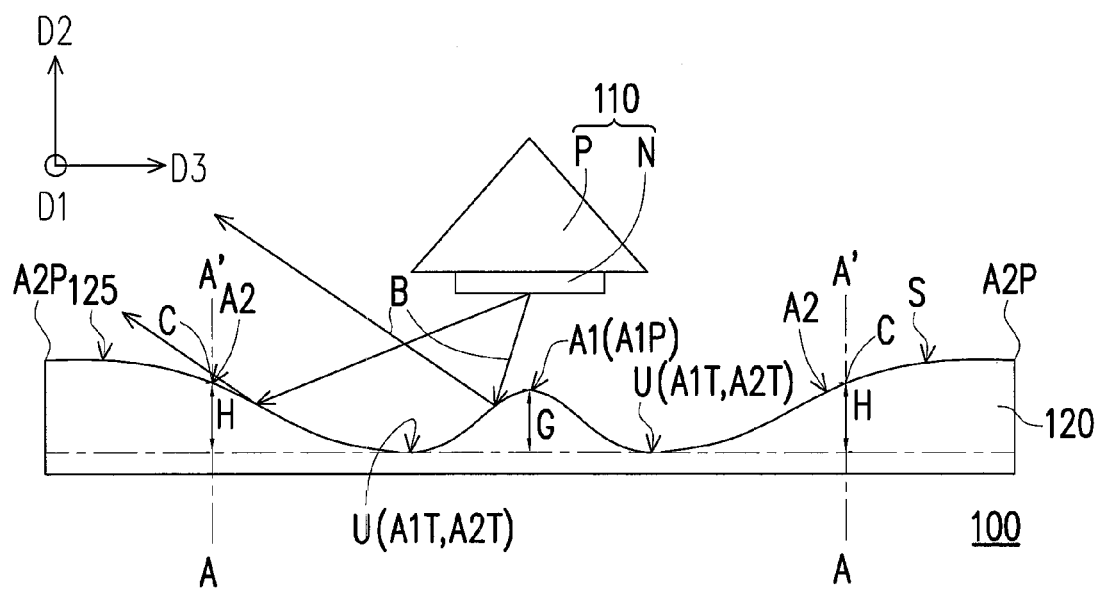
FIG. 3B is a cross-sectional view of two sides of the light emitting unit in the embodiment of FIG. 1.

FIG. 3A is a cross-sectional view of the centre of the light emitting unit 100 in the embodiment of FIG. 1, and FIG. 3B is a cross-sectional view of the two sides of the light emitting unit 100 in the embodiment of FIG. 1. Referring to FIG. 1 to FIG. 3B, in this embodiment, the height H of the cross section contour C along any section line AA' of the pair of second protrusions A2 in parallel with the extension direction D1 and located between the trough portion A2T and the peak portion A2P of the second protrusion A2 is decreased from the centre C1 to the two ends E1 and E2 of the reflector 120 (as shown in FIG. 2B). For example, a cross section contour S as shown in FIG. 3A is, for example, the cross section of the reflector 120 on the centre reference cross section CR, and a cross section contour S as shown in FIG. 3B is, for example, the cross section of two reference cross sections ER located on two ends E1 and E2 of the reflector 120 as shown in FIG. 2A and FIG. 2B. The height H of the second protrusion A2 in FIG. 3A is higher than the height H of the second protrusion A2 in FIG. 3B, so that the light beam B emitted by the light source device 110 in FIG. 3A is easily reflected by the second protrusion A2 with the higher height H and is concentrated at an above position of the first protrusion A1. On the other hand, the light beam B emitted by the light source device 110 in FIG. 3B is easily reflected by the second protrusion A2 with the lower height H and is diverged away from the above position of the first protrusion A1. In FIG. 3B, the light beam B emitted by the light source device 110 is easily reflected by the second protrusion A2 with the lower height H and is diverged away from the above position of the first protrusion A1, so that the brightness of the two sides of the light emitting element N is improved, therefore, as compared with the prior art, a problem of bright and dark fringes of the light emitting unit 100 near the edge zone ZE may be solved. In addition, the height H of the cross section contour C of the pair of second protrusions A2 in parallel with the extension direction D1 is decreased from the centre C1 to the two ends E1 and E2 of the reflector 120 (referring to FIG. 2B), so that the light beam B reflected by the reflector 120 may be transmitted to the two ends E1 and E2 of the reflector 120, so as to compensate the edge zone ZE originally having insufficient light intensity, thereby increasing the light emitting uniformity. It should be noted that, in this embodiment, the height H of the cross section contour C of the second protrusion A2 in parallel with the extension direction D1 is defined as a vertical distance between a lowest point U (that is, the trough portion A1T or A2T) of the cross section contour S of the reflection surface 125 vertical to the extension direction D1 and the cross section contour C of the second protrusion A2. In an embodiment, the height of the peak portion A2P of the second protrusion A2 remains unchanged, and in another embodiment, the height of the peak portion A1P of the first protrusion A1 remains unchanged, wherein the invention is not limited thereto.

In this embodiment, gradual changing degrees of the pair of second protrusions A2 are approximately the same. In this embodiment, decreasing degrees of the pair of second protrusions A2 are approximately the same. In other words, the reflector 120 is, for example, a structure with symmetrical left and right parts, so that design and manufacture are easy, and the light emitting unit 100 is enabled to have a uniform light emitting effect. However, in other embodiments, the reflector 120 may also be asymmetrical in response to different optical property demands.

In other embodiments, a height G of the peak portion A1P of the first protrusion A1 may also be decreased from the centre C1 to the two ends E1 and E2 of the reflector 120, and the change of the height G of the first protrusion A1 is smaller than the change of the height H of the second protrusion A2, thereby having the effect being similar to the gradually changing second protrusion A2, which is not described in detail here. In other words, both the first protrusion A1 and the second protrusion A2 of the invention have the gradually changing structure, or only the second protrusion A2 has the gradually changing structure, and the similar effect exists, which is not described in detail here. The definition of the height G of the peak portion A1P of the first protrusion A1 is similar to the definition of the height H of the cross section contour C of the second protrusion A2 in parallel with the extension direction D1, being the vertical distance between the lowest point U (that is, the trough portion A1T or A2T) of the cross section contour S and the peak portion A1P of the first protrusion A1. The definition of the height of the specification is similar to the definition of the height G of the first protrusion A1 and the height H of the cross section contour C of the second protrusion A2 in parallel with the extension direction D1, which is not described in detail thereafter.

Figure 4:
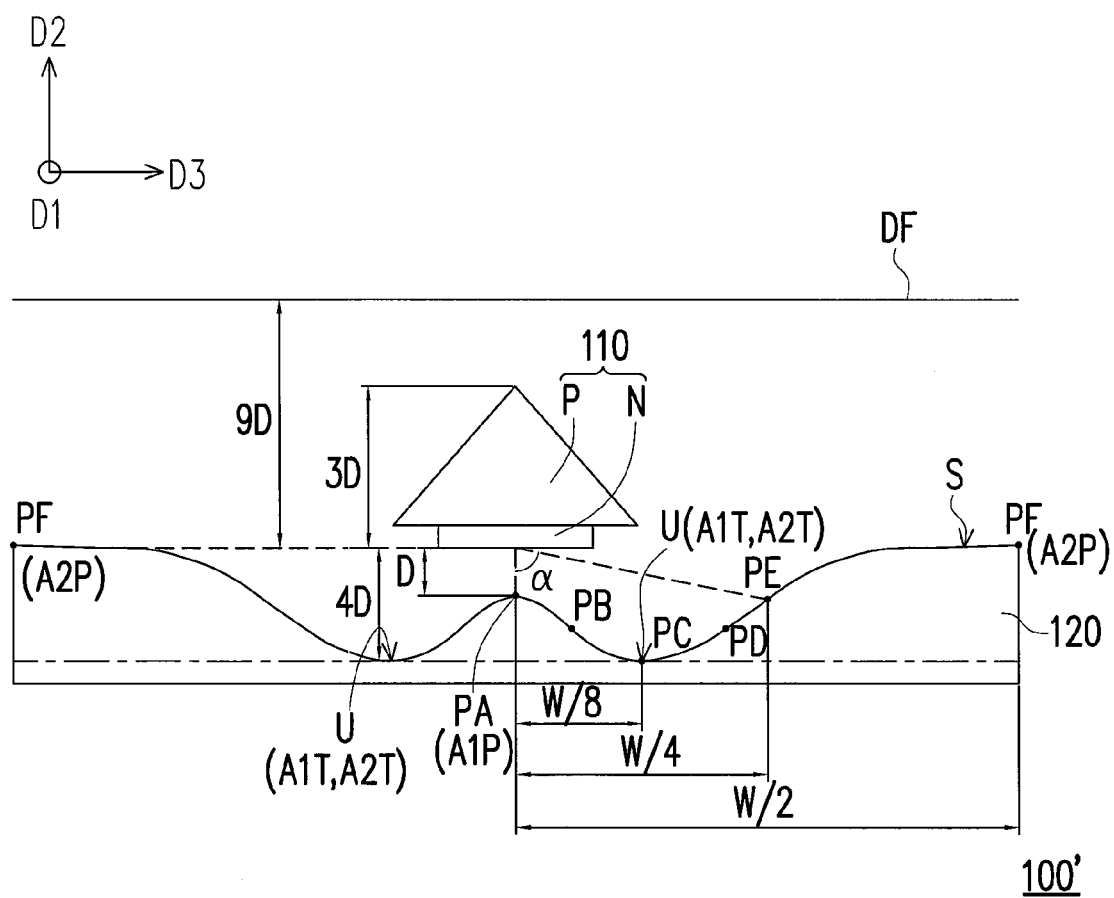
FIG. 4 is a schematic cross-sectional view of a light emitting unit.

FIG. 4 is a schematic cross-sectional view of a light emitting unit 100'. This embodiment is similar to FIG. 3A, but in this embodiment, the light emitting unit 100' may further include a light diffuser DF, configured above the light source device 110 and the reflector 120 and used to further diffuse the light beam reflected by the reflector 120, so that the light emission of the light emitting unit 100' may be more uniform. In detail, the reflector 120 may change characteristics of the cross section contour S by designing several control points (that is, a control point PA, a control point PC, a control point PE, and a control point PF) in the following. For example, in this embodiment, the cross-sectional view as shown in FIG. 4 for example shows the position similar to the centre reference cross section CR in FIG. 1, wherein the control point PA is located on the highest position (that is, the peak portion A1P) of the first protrusion A1 of the cross section contour S, the control point PC is located on the lowest point U (that is, the trough portions A1T and A2T) of the cross section contour S, the control point PE is located on the second protrusion A2 of the cross section contour S, and the control point PF is located on the two ends (that is, the peak point A2P) of the cross section contour S. In this embodiment, the height of the control point PA is the same as the height of the control point PE, and the height change of the cross section contour S from the control point PC to the control point PE is greater than the height change of the cross section contour S from the control point PE to the control point PF. For example, in this embodiment, a height difference between the control point PA and the control point PC is, for example, 6.5 mm, and a height difference between the highest position and the lowest position of the cross section contour S is, for example, 11.5 mm (that is, the distance 4D as shown in FIG. 4, and the distance D is approximately 2.875 mm), a total width distance (that is, a distance between the peak portions A2P of the two second protrusions A2) of the cross section contour S in parallel with the direction D3 is W, and in this embodiment, a distance W is, for example, 100 mm, but the invention is not limited thereto.

Still referring to FIG. 4, in this embodiment, the distance between the control point PA and the control point PF in parallel with the direction D3 is W/2; the distance between the control point PA and the control point PE in parallel with the direction D3 may be between 7W/48 and 17W/48, and is, for example, W/4 in this embodiment; the distance between the control point PA and the control point PC in parallel with the direction D3 may be between ⅓ and ⅔ of the distance between the control point PA and the control point PE in parallel with the direction D3, and is, for example, ½ of the distance between the control point PA and the control point PE in parallel with direction D3 in this embodiment, that is, ½ of W/4=W/8. The distance between the control point PA and the light source device 110 along the direction D2 is D (approximately 2.875 mm), the distance between the lowest point U of the cross section contour S and the light source device 110 along the direction D2 is 4D, the size of the light source device 110 along the direction D2 is 3D, and the distance between the light emitting element N of the light source device 110 and the light diffuser DF along the direction D2 is 9D. However, the above mentioned numerical data is only used to illustrate this embodiment, in other embodiments, by suitably adjusting the distance D and the distance W, the bright and dark strips of the emitted light may be adjusted. For example, if the distance between the control point PA and the control point PE is smaller than 7W/48 (for example, 6W/48), the light intensity above the heat dissipation column P is easily higher than other zones, so that bright strips occur; if the distance between the control point PA and the control point PE is greater than 17W/48 (for example, 18W/48), the light intensity above the heat dissipation column P is easily lower than other zones, so that dark strip occur. In addition, other distance parameters should be suitably set to prevent from generating the bright and dark strips to result in poor light emitting uniformity.

In this embodiment, an included angle α between a connection straight line between the light emitting element N and the control point PA and a connection straight line between the light emitting element N and the control point PE may be between 80 degrees and 90 degrees, and in this embodiment, the included angle α is, for example, 84 degrees. That is to say, when the light emitting element N is, for example, an LED, the part of the cross section contour S between the control point PA and the control point PE is located in the light emitting angle scope of most of the light beams of the light emitting element N, so that most of the light beams emitted by the light emitting element N are irradiated on the first protrusion A1 and the second protrusion A2 and are reflected for light emission according to design. Curve changes of the cross section contour S between the control point PA and the control point PC and between the control point PC and the control point PE may be a plurality of connected straight line segments, polynomial curves, and Bezier curves etc.

Figure 5A:
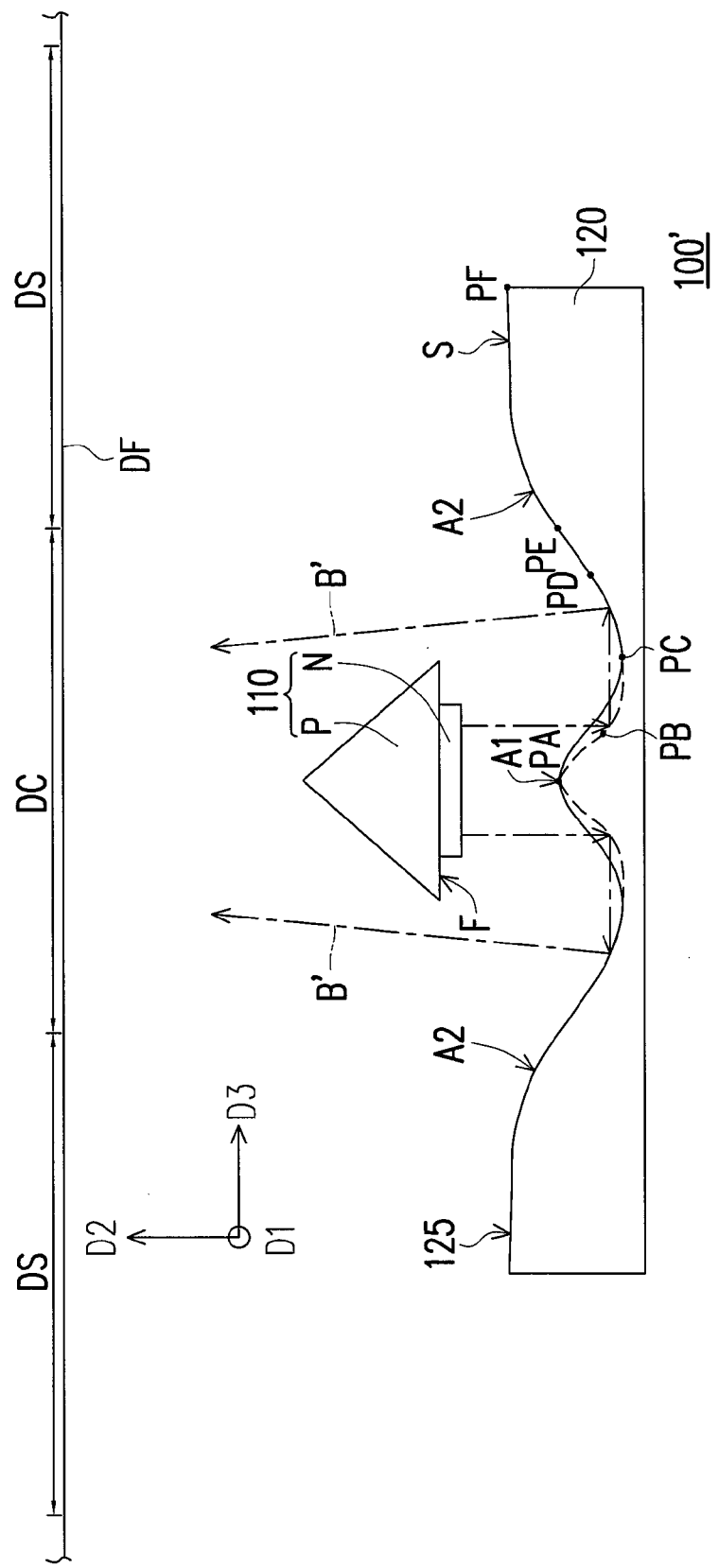
FIGS. 5A to 5D are schematic views of various cross section contours.
Figure 5B:
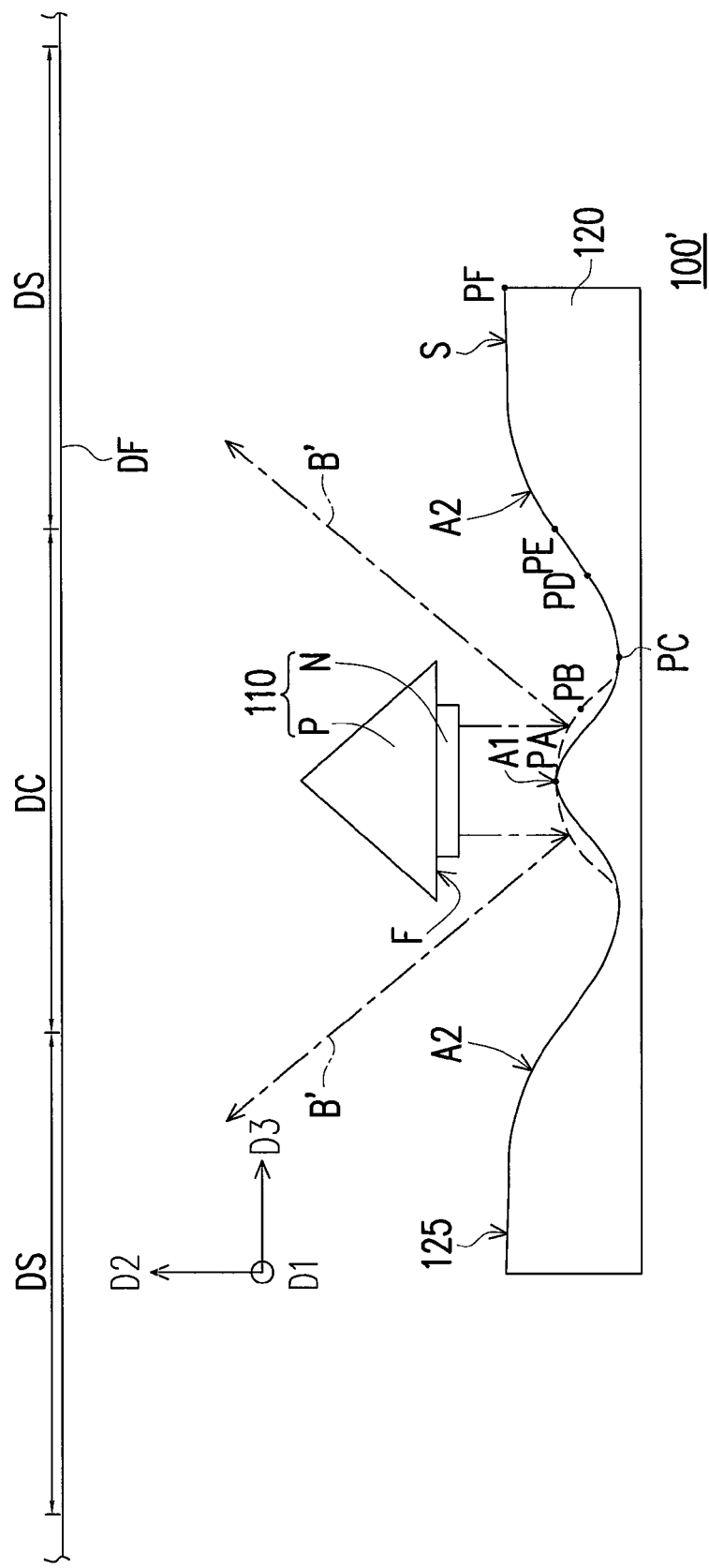
Figure 5C:
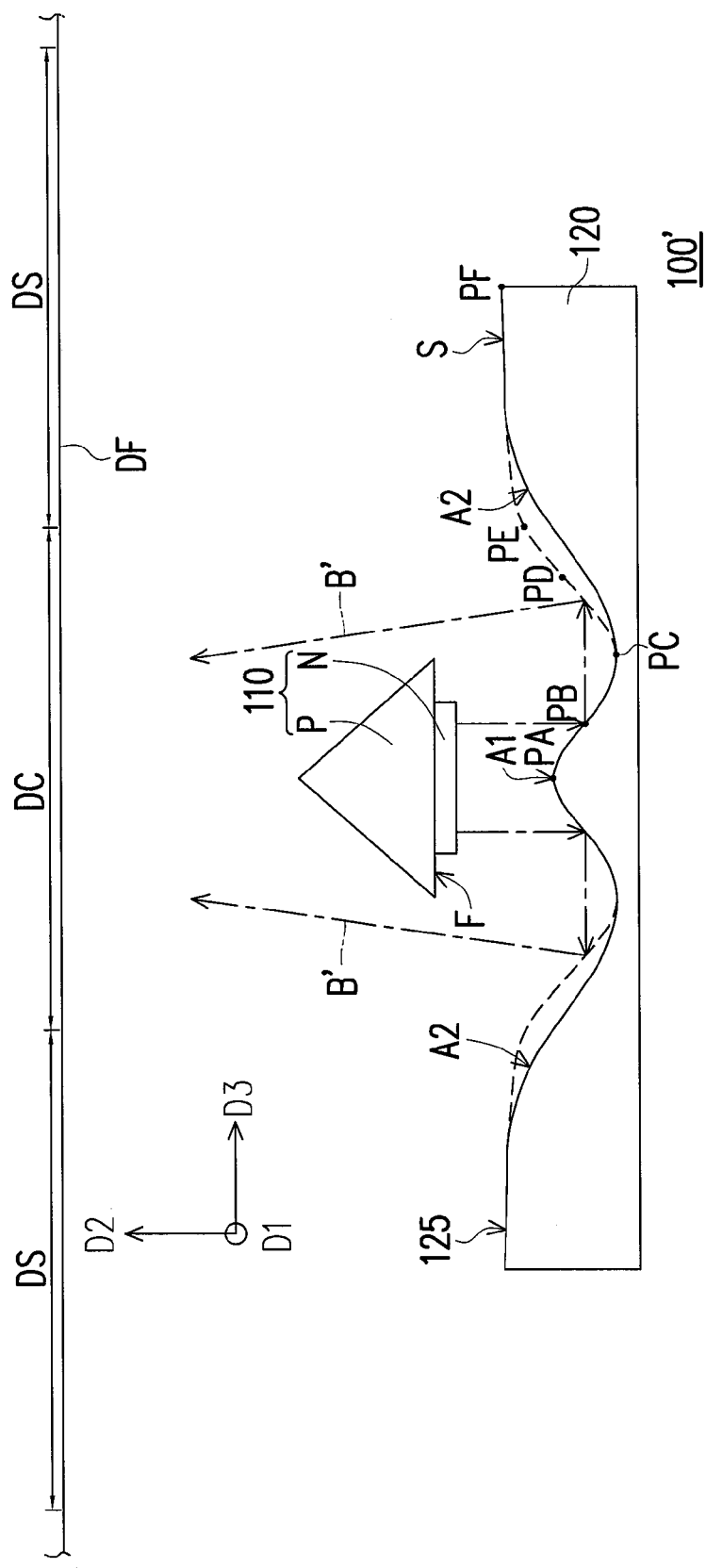
Figure 5D:
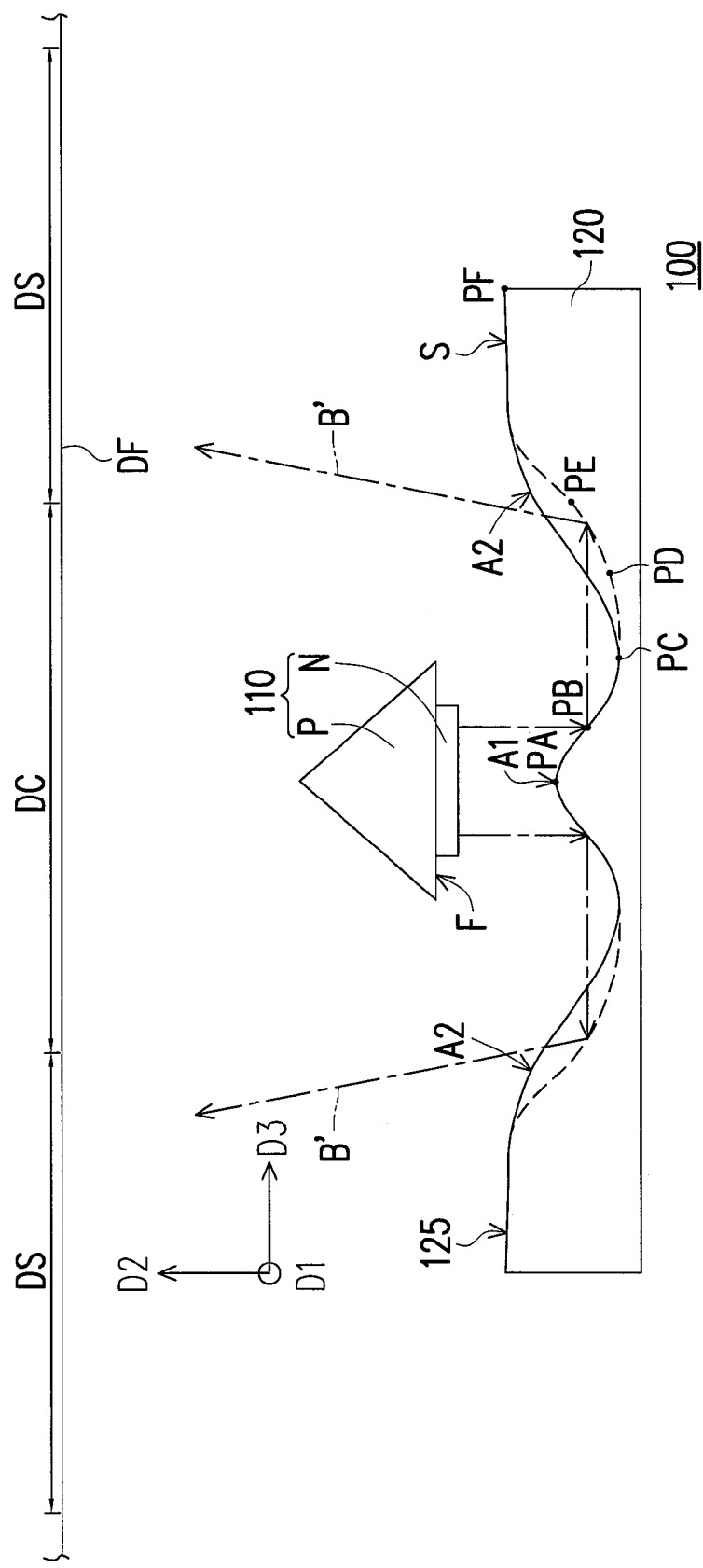
Figure 5E:
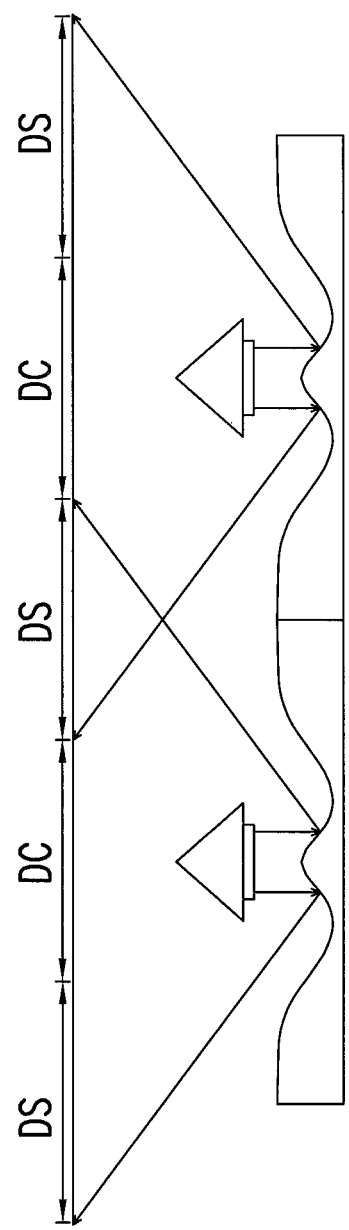
FIG. 5E is a schematic view of a cross section contour of a light emitting unit having a plurality of the light source devices.

FIGS. 5A to 5D are schematic views of various cross section contours. Referring to FIG. 5A, in this embodiment, at the zone ZR near the centre of the reflector 120 (or near the centre C1) (as shown in FIG. 2A), the local reflection surface 125 between the control point PA and the control point PC on the cross section contour S is fabricated as a recess surface (as shown by dashed lines of FIG. 5A), in other words, the height of the control point PB is decreased, so that the light beam B may be transmitted to a centre zone DC on the light diffuser DF in a more convergent travelling route of the light beam B' (as shown in FIG. 5A). Referring to FIG. 5B, in this embodiment, at the edge zone ZE of the reflector 120 (or near the reference cross section ER) (as shown in FIG. 2A), the local reflection surface 125 between the control point PA and the control point PC on the cross section contour S is fabricated as a protruding surface (as shown by dashed lines of FIG. 5B), in other words, the height of the control point PB is increased, so that the light beam B may be transmitted to a side zone DS on the light diffuser DF in a more divergent travelling route of the light beam B' (as shown in FIG. 5B). In addition, in another embodiment, at the zone ZR near the centre of the reflector 120 (or near the centre C1) (as shown in FIG. 2A), the height of the control point PD on the cross section contour S is increased, in other words, when the local reflection surface 125 between the control point PC and the control point PE is a protruding surface (as shown by the dashed lines in FIG. 5C), the light beam B may be transmitted to the centre zone DC on the light diffuser DF in the more convergent travelling route of the light beam B' (as shown in FIG. 5C); in another embodiment, at the edge zone ZE of the reflector 120 (or near the reference cross section ER) (as shown in FIG. 2A), the height of the control point PD on the cross section contour S is decreased, in other words, when the local reflection surface 125 between the control point PC and the control point PE is a recess surface (as shown by the dashed lines in FIG. 5D), the light beam B may be transmitted to the side zone DS on the light diffuser DF in the more divergent travelling route of the light beam B'. Therefore, the control points are designed in the reflector 120, so that the light emission of the light emitting unit 100' from the light diffuser DF is uniform. For example, at the edge zone ZE of the reflector 120 (or near the reference cross section ER), the local reflection surface 125 between the control point PA and the control point PC on the cross section contour S is fabricated as the protruding surface, or the local reflection surface 125 between the control point PC and the control point PE is fabricated as the recess surface; and at the zone ZR near the centre of the reflector 120, the local reflection surface 125 between the control point PA and the control point PC on the cross section contour S is fabricated as the recess surface, or the local reflection surface 125 between the control point PC and the control point PE is fabricated as the protruding surface.

It should be noted that in this embodiment, one light emitting unit 100' is set as an example, but in other embodiments, a plurality of the light emitting units 100' are arranged along, for example, the direction D3, and by designing the control points, the light emitting distribution of each light emitting unit 100' on the light diffuser DF is reduced from the centre zone DC to the side zone DS (the centre zone DC here is, for example, the zone on the light diffuser DF corresponding to the zone between the control point PA and the control point PE, and the side zone DS is, for example, the zone on the light diffuser DF corresponding to the zone between the control point PE and the control point PF on the reflection surface 125, but the invention is not limited here), wherein the light intensity of the centre zone DC is approximately two times of the light intensity of the side zone DS, in this manner, after a plurality of the light emitting units 100' are arranged along the direction D3, the light intensity of the side zone DS may overlap with the two neighboring light emitting units 100' to be similar to the light intensity of the centre zone DC of each light emitting unit 100'. In other words, the overall light emitting intensity of a plurality of the light emitting units 100' remains to be uniform, as shown in FIG. 5E.

Still referring to FIG. 5A to FIG. 5D, further, the heat dissipation column P is, for example, a polygonal column, and the light emitting elements N are configured on a column surface of the polygonal column facing the reflector 120. For example, in this embodiment, the heat dissipation column P is, for example, a triangular column, a column surface F of the triangular column faces the reflector 120, and the light emitting element N may be configured on the column surface F and arranged in parallel with the extension direction D1.

Figure 6A:
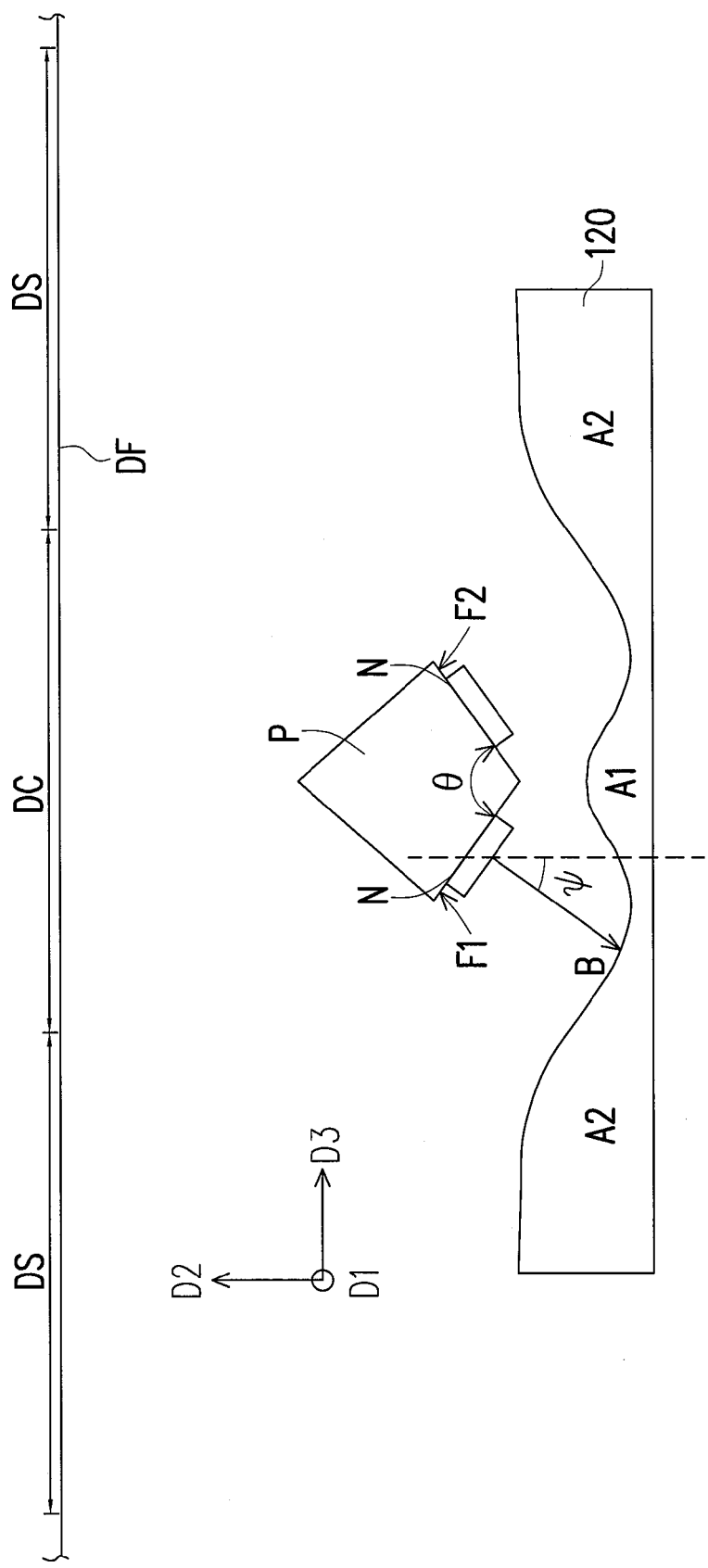
FIGS. 6A to 6C are schematic cross-sectional views of a light emitting unit in another embodiment.
Figure 6B:
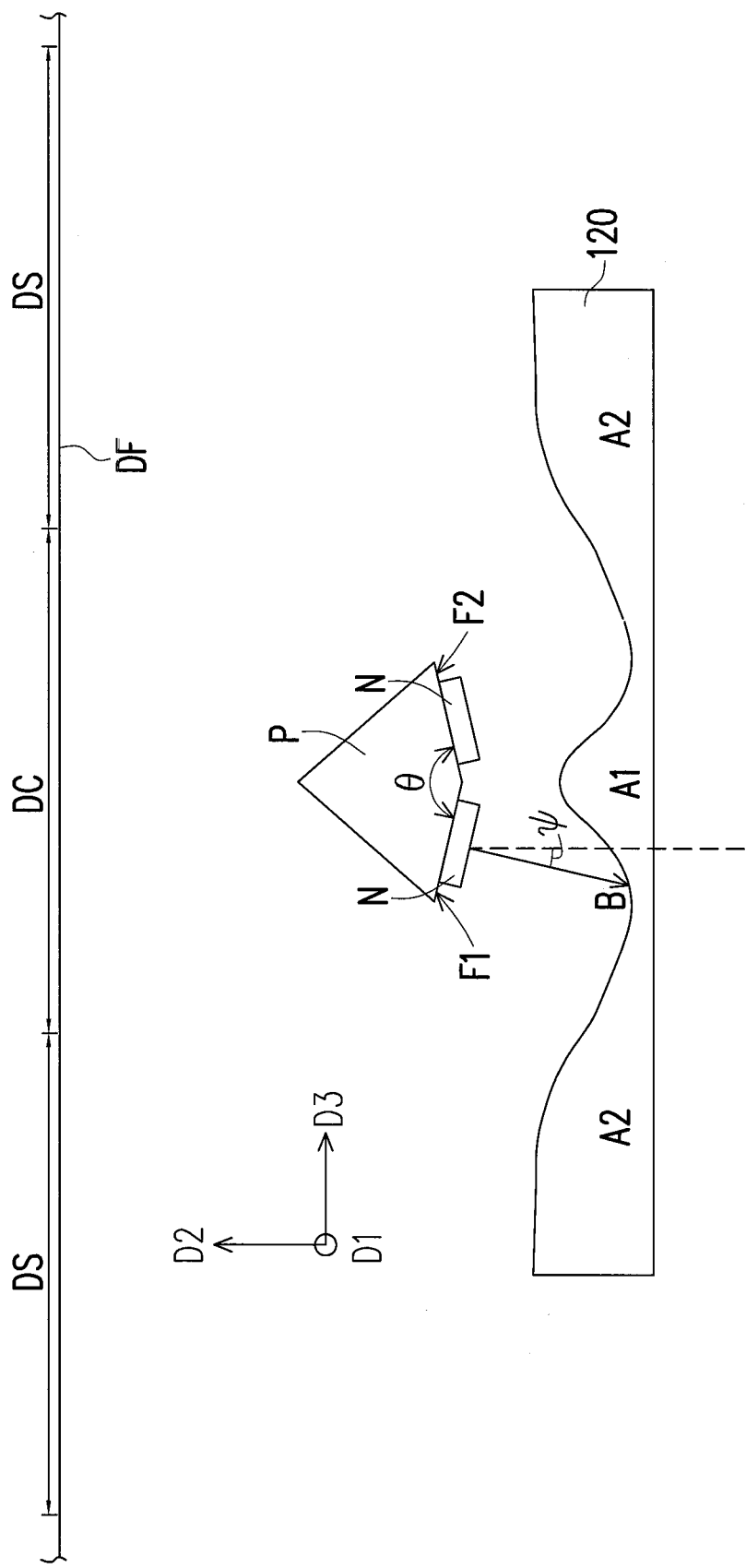

FIGS. 6A and 6B are schematic cross-sectional views of a light emitting unit in another embodiment. Referring to FIG. 1 to FIG. 6B, the polygonal column may be a quadrangular column with a kite cross section as shown in FIG. 6A, but the invention is not limited thereto. Further, the light emitting elements N may be configured on two neighboring column surfaces F1 and F2 of the polygonal column facing the reflector 120. In other words, as shown in FIG. 6A and FIG. 6B, the light emitting elements N may be configured on the two neighboring column surfaces F1 and F2 of the quadrangular column facing the reflector 120, in this manner, more light emitting elements N may be configured on each heat dissipation column P to increase the brightness, and the reflection surface 125 may enable the light beam B to be uniformly distributed.

Further, in parallel with the extension direction D1, an included angle (that is, a column angle θ) of the two neighboring column surfaces F1 and F2 may also gradually change from the centre C1 to the two ends E1 and E2 of the polygonal column (that is, the heat dissipation column P) (referring to FIG. 2A), therefore, through changes of the column angle θ of the heat dissipation column P, the distribution position of the light beam B may be changed, in other words, the column angle θ may be used as one of the change factors for adjusting the light emitting shape. In more detail, in this embodiment, when the column angle θ of the heat dissipation column P near the edge zone ZE of the reflector 120 becomes smaller (as shown in FIG. 6A), the light emitting element N may be incident to the reflector 120 with a greater angle ψ (that is, the included angle between the light beam B and the direction D2). When the column angle θ of the heat dissipation column P near the centre zone ZR of the reflector 120 becomes larger (as shown in FIG. 6B), the light emitting element N may be incident to the reflector 120 with a smaller angle ψ, so as to further adjust the distribution state of the light beam B, thereby realizing the uniformization effect of the light emitting intensity. In other words, the included angle (that is, a column angle θ) of the two neighboring column surfaces F1 and F2 is decreased in parallel with the extension direction D1 from the centre C1 to the two ends E1 and E2 of the polygonal column. In addition, in this embodiment, the first protrusion A1 and the second protrusion A2 of the reflector 120 may match the change of the column angle θ of the heat dissipation column P, so as to further adjust the light emitting shape of the light emitting unit, thereby uniformizing the overall light emission. For example, when the column angle θ of the heat dissipation column P is smaller (as shown in FIG. 6A), the angle ψ with which the light beam B is incident to the reflector 120 becomes greater, and the light beam B is easily diverged to the side zone DS, so as to increase the height of the second protrusion A2 (or decrease the first protrusion A1), so as to converge the light beam B, thereby preventing the light beam B from being excessively diverged. When the column angle θ of the heat dissipation column P is greater (as shown in FIG. 6B), the angle ψ with which the light beam B is incident to the reflector 120 becomes smaller, and the light beam B is easily concentrated at the centre zone DS, so as to decrease the height of the second protrusion A2 (or increase the first protrusion A1), so as to diverge the light beam B, thereby preventing the light beam B from being excessively concentrated.

Figure 6C:
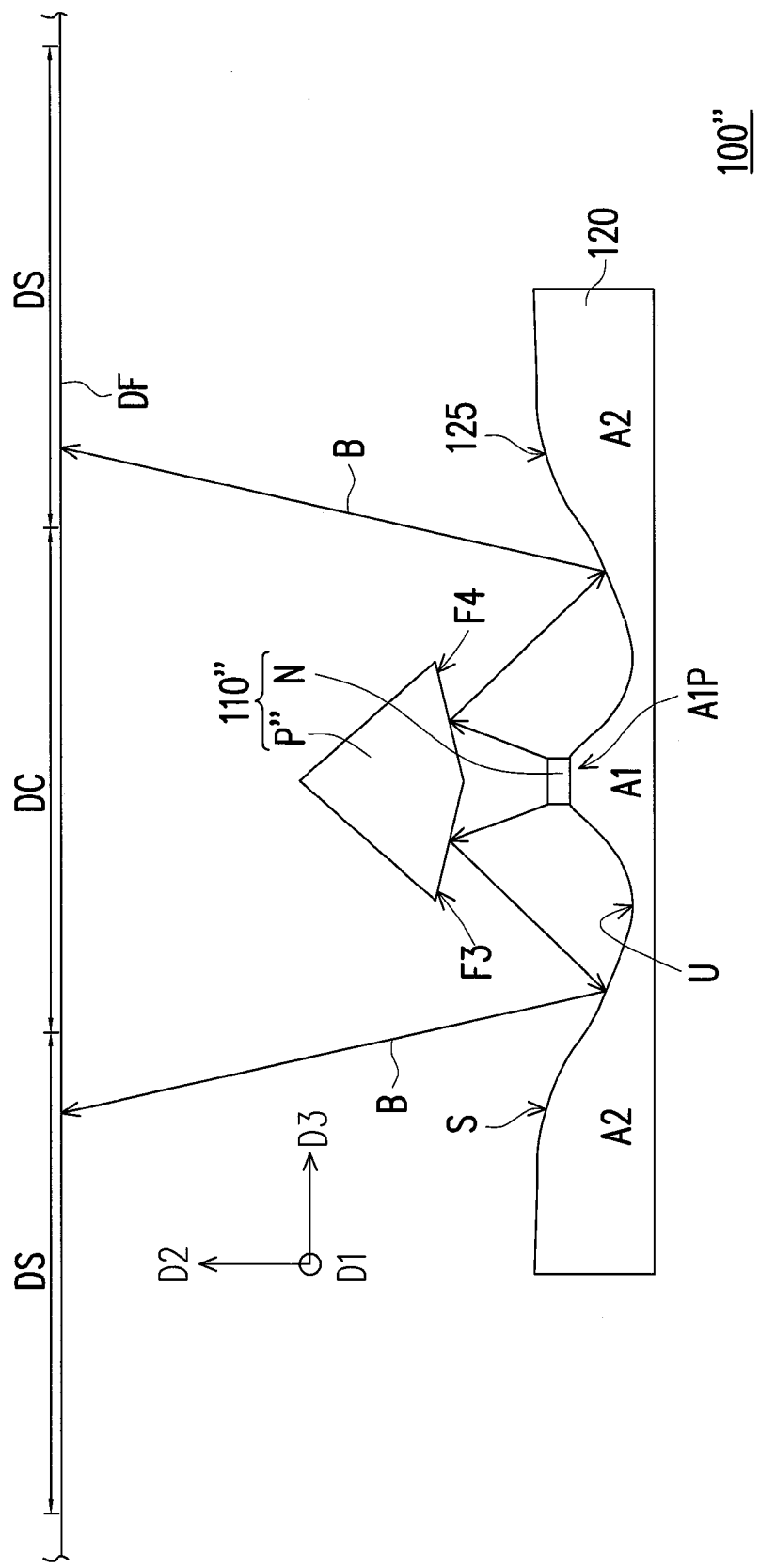

FIG. 6C is a schematic cross-sectional view of a light emitting unit in another embodiment. This embodiment of FIG. 6C is similar to FIG. 6A and FIG. 6B, the different is that a light source device 110" of the light emitting unit 100". In more detail, the light source device 110" includes a column P" and a plurality of light emitting elements N, the column P" extends along the extension direction D1, the light emitting elements N are configured on the peak portion A1P of the first protrusion A1 of the reflector 120 along the extension direction D1, and the light emitting elements N face a column surface of the column P". In this embodiment, the column P" is a polygonal column, and the light emitting elements N face two neighboring column surfaces F3 and F4 of the polygonal column. The light beam B emitted from the light emitting element N is incident to the column surfaces F3 and F4, then reflected by the column surfaces F3 and F4 to the reflector 120, and then reflected by the reflector 120 to the light diffuser DF. Therefore, the light beam B is reflected at least two times to the light diffuser DF, so as to reduce the distance between the lowest point U of the cross section contour S of the reflection surface 125 and the light diffuser DF along the direction D2 (referring to FIG. 4). For example, the distance between the lowest point U of the cross section contour S of the reflection surface 125 and the light diffuser DF of FIG. 4 is approximately 37.375 mm, the distance between the lowest point U of the cross section contour S of the reflection surface 125 and the light diffuser DF of FIG. 6C is approximately 30 mm, the distance is apparently reduced. In addition, the column P" is made of metal (for example, silver) or the column surfaces F3 and F4 of the column P" are coating a material having a good reflectivity, such as metal (for example, silver).

Figure 7:
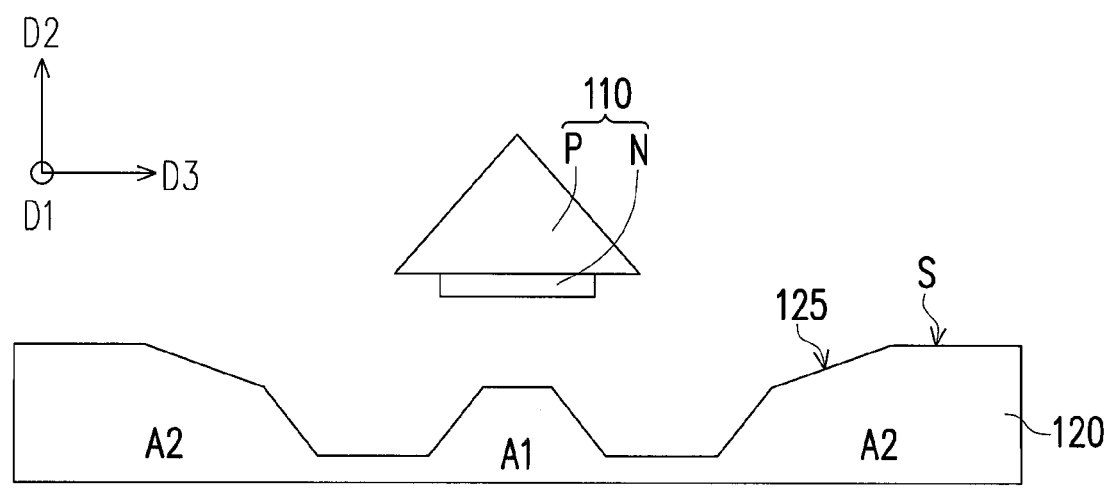
FIG. 7 is a schematic cross-sectional view of a variation of the reflector in the embodiment of FIG. 1.

FIG. 7 is a schematic cross-sectional view of a variation of the reflector in the embodiment of FIG. 1. Referring to FIG. 1 and FIG. 7, in this embodiment, the reflector 120 is made by a sold core substrate K having a proper thickness, wherein the reflection surface 125 may be a fluctuant surface on the substrate K. However, in other embodiments, the reflector 120 may also be a sheet shaped plate (thin sheet shape), but the invention is not limited thereto. The reflector 120 may realize the curved surface effect by utilizing manners including injection formation, thermal-formation (for example, heat pressing or heat sealing) or plate metal formation or turning, and the reflection surface 125 may include a material having a good reflectivity including a polyethylene terephthalate (PET) reflecting material, polycarbonate (PC) reflecting material or a material plating film, but the invention is also not limited thereto. In the embodiment of FIG. 1, the reflection surface 125 may be formed by a plurality of curved surfaces connected to one another, for example, the peak portion A1P and the trough portion A1T of the first protrusion A1 may be connected by one curved surface or two curved surfaces (as shown in FIG. 4, a first curved surface exists between PA and PB, and a second curved surface exists between PB and PC, wherein the first curved surface and the second curved surface are the same curved surface or different curved surfaces), and the trough portion A2T and the peak portion A2P of the second protrusion A2 may be connected by one curved surface, two curved surfaces, or three curved surfaces (as shown in FIG. 4, a third curved surface exists between PC and PD, a fourth curved surface exists between PD and PE, and a fifth curved surface exists between PE and PF, wherein the third curved surface, the fourth curved surface, and the fifth curved surface are the same curved surface or different curved surfaces or two of them are the same curved surface). However, in the embodiment as shown in FIG. 7, the reflection surface 125 may also be formed by a plurality of plane surfaces connected to one another, thereby further simplifying the manufacturing process and being beneficial for lowering a manufacturing cost, and meanwhile having the effect being similar to that of the reflection surface 125 in the embodiment of FIG. 1.

Still referring to FIG. 1, in this embodiment, the reflector 120 may further include a supporting wall 129, and the supporting wall 129 is connected to the peak portion A2P of the second protrusion A2 to form two side boundaries of the cross section contour S of the reflector 120 vertical to the extension direction D1. For example, as shown in FIG. 1, in this embodiment, the supporting wall 129 may be two side stand walls of the substrate K of the reflector 120, but in other embodiments, when the reflector 120 is a sheet shaped plate (for example, a wave shaped thin sheet), the supporting wall 129 may be considered as extension of the second protrusion A2 towards a negative direction of the direction D2 and is used to support the weight of the reflector 120 to maintain the shape of the reflection surface 125.

In addition, the reflector 129 may further include at least one hole 137 located on the supporting wall 129 and a fixing part CC corresponding to configure in the hole 137, and the reflector 120 is connected to and is fixed with a neighboring reflector 120 through the fixing part CC. As shown in FIG. 1, the fixing part CC may be, for example, a screw bolt or a snapping tenon, capable of locking the reflector 120 with another neighboring reflector 120, so that the reflection surface 125 formed by a plurality of the reflectors 120 reflects the light beam B of each corresponding light source device 110 to achieve uniform light emission. The number, the shape, and the position of the hole 137 and the fixing part CC as shown in FIG. 1 are only used to exemplarily illustrate this embodiment, but the invention is not limited thereto. Therefore, the reflector 120 may be easily manufactured and assembled, so that the manufacturing cost is saved, the volume is small, and the assembly is easy, thereby being applied to various backlight devices.

Figure 8A:
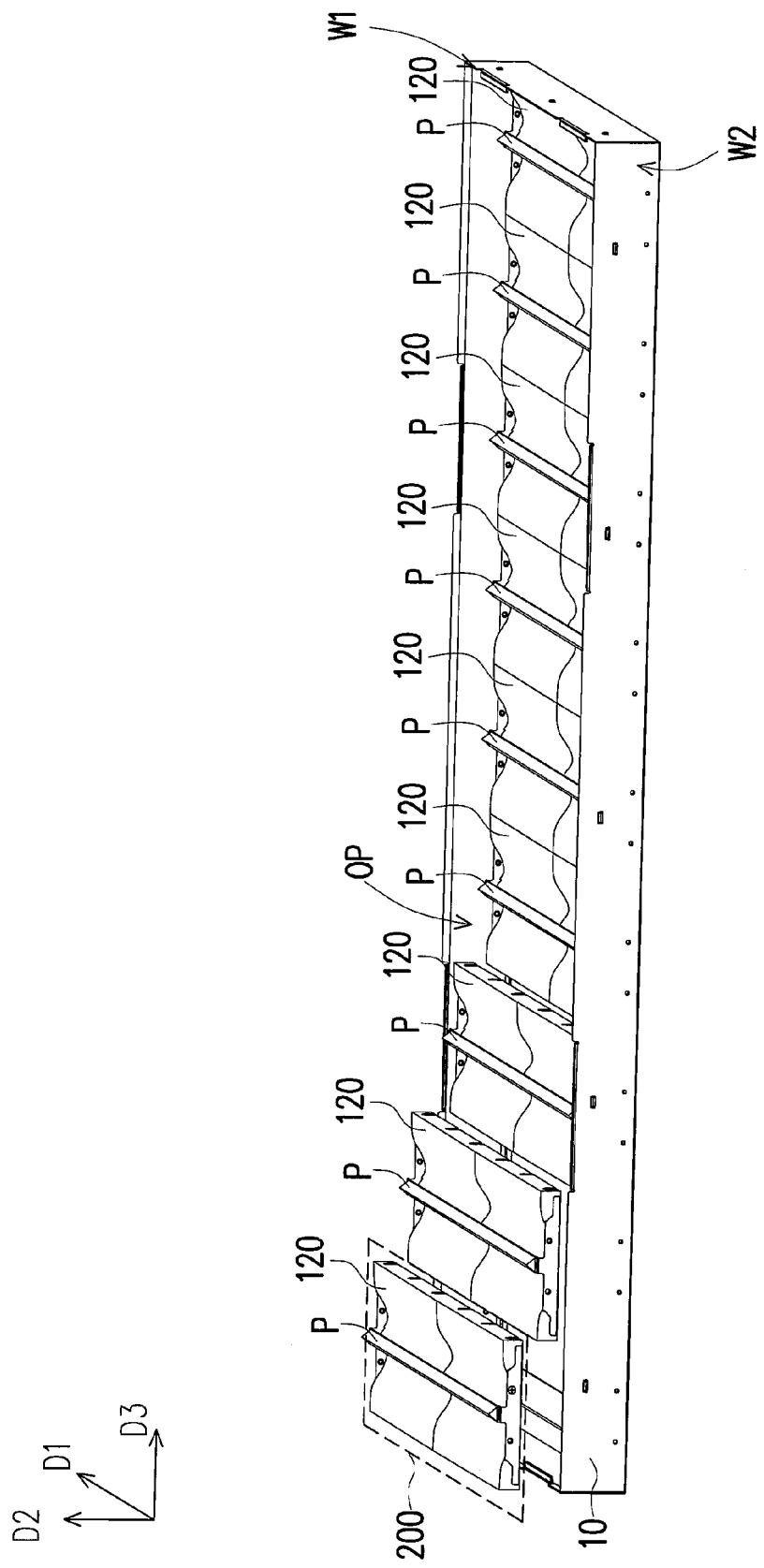
FIG. 8A is a schematic view wherein a plurality of the light emitting units are arranged in a lamp case.
Figure 8B:
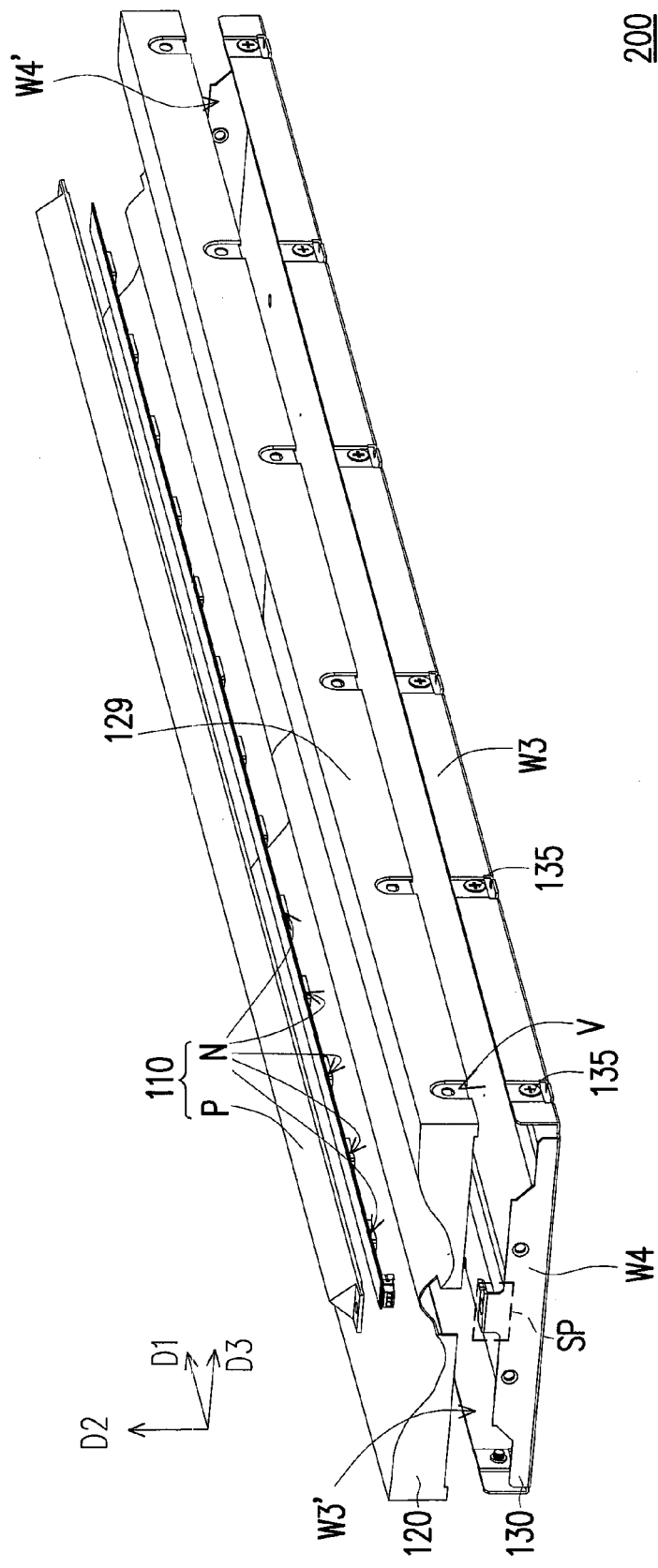
FIG. 8B is an exploded view of a variation of the light emitting unit in the embodiment of FIG. 8A.
Figure 8C:
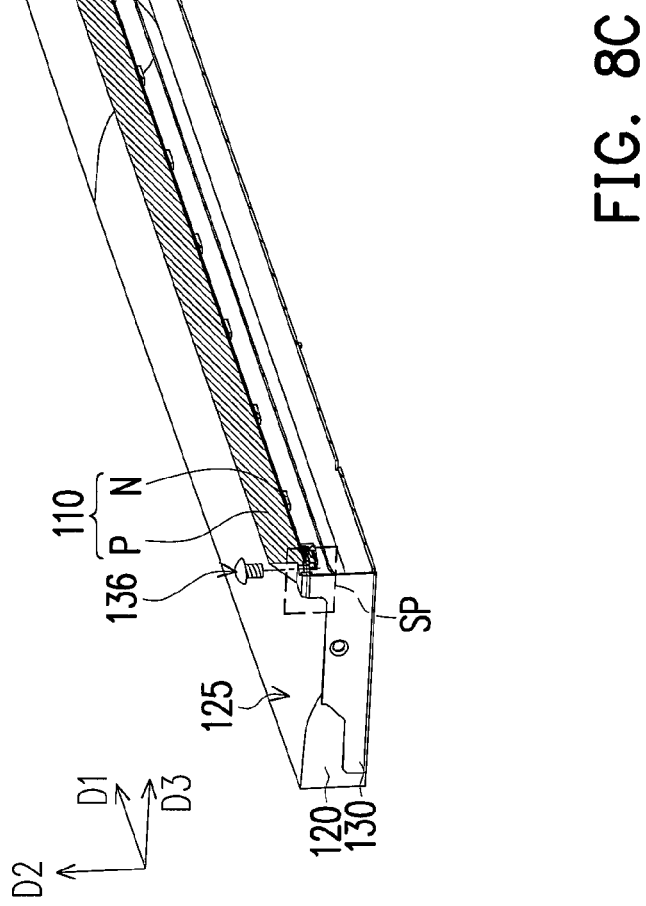
FIG. 8C is a schematic cross session view of the light emitting unit.

FIG. 8A is a schematic view wherein a plurality of the light emitting units are arranged in a lamp case, FIG. 8B is an exploded view of the light emitting units in the embodiment of FIG. 8A, and FIG. 8C is a schematic cross session view of the light emitting unit. Referring to FIG. 8A, in this embodiment, one or more light emitting units 200 may be configured in a lamp case 10 along the direction D3. However, in other embodiments, a plurality of the light emitting units 200 may also be arranged and disposed in a lamp case along the direction D1, so as to elongate the light emitting area, but the invention is not limited thereto. Further, the two ends of the heat dissipation columns P along the extension direction D1 of the light source device 110 may lie across or be fixed on two side walls, for example, side walls W1 and W2 as shown in FIG. 8A, opposite to a light emitting port OP of the lamp case 10 through a tenon or in other locking manners. In other embodiments, other elements, for example, the light diffuser and a protective light transparent layer may also be configured at the light emitting port OP of the lamp case 10 and cover the light emitting units 200 located in the lamp case 10, but the invention is not limited thereto. As shown in FIG. 8A, the reflector 120 may be configured and arranged in the lamp case 10, in other embodiments, a bottom of the lamp case 10 may also be directly designed as the fluctuant reflection surface 125 having, for example, the reflector 120, so that the light emitting units 200 have the uniform light emission, but the invention is not limited thereto.

Referring to FIG. 8B, in this embodiment, the light emitting unit 200 may further include a module supporting frame 130, wherein the reflector 120 and the heat dissipation column P may be fixed on the module supporting frame 130. In this embodiment, the module supporting frame 130 has a first side wall W3, a second side wall W3' opposite to the first side wall W3, a third side wall W4, and a fourth side wall W4' opposite to the third side wall W4, wherein the first side wall W3 and the second side wall W3' are in parallel with the extension direction D1 of the light source device 110, the third side wall W4 and the fourth side wall W4' are vertical to the first side wall W3 and the second side wall W3' (the extension direction D1). In detail, as shown in FIG. 8B, the reflector 120 is, for example, a thermal-formed reflecting block, and a fixing part 135 (for example, the screw or tenon) penetrates an accommodation recess V on the supporting wall 129 of the two sides of the reflector 120 and the perforation (not shown) of the module supporting frame 130, so as to fix the module supporting frame 130 and the reflector 120.

Referring to FIG. 8C together, FIG. 8C is a schematic view wherein the reflector 120 is sectioned at the position of the peak portion of the first protrusion A1 along a plane surface formed by extending the directions in parallel with the direction D1 and the direction D2 in FIG. 8B, wherein the heat dissipation column P may pass through two supporting portions SP (FIG. 8B only shows one of the supporting portions SP) on the third side wall W4 and the fourth side wall W4' of the module supporting frame 130, is fixed through a fixing part 136 (for example, the screw or the tenon) and suspends on the reflector 120. As described above, in other embodiments, the heat dissipation column P may pass through the supporting portions (not shown) on the side walls W1 and W2 of the lamp case 10 in the similar manner, is fixed through the screw or the tenon and suspends on the reflector 120. In this manner, the light emitting elements N emit the light beam towards the reflector 120 under the situation that the light beam is not blocked by the heat dissipation column P. Therefore, the light emitting unit 200 is easily manufactured and assembled, so that the manufacturing cost is saved, the volume is small, and the assembly is easy, thereby being applied to various backlight devices.

To sum up, the embodiment or embodiments of the invention may have at least one of the following advantages: the reflector of the light emitting unit according to the embodiment of the invention has a first protrusion and a pair of second protrusions located on the two sides of the first protrusion to provide a fluctuant reflection surface. Further, the height of the cross section contour of the pair of second protrusions in parallel with the extension direction of the light source device is decreased from the centre to the two ends of the reflector, so that the light beam is distributed from the non-edge zone to the edge zone, so as to balance the light emitting intensities of the center (for example, the non-edge zone) and the two ends (for example, the edge zone) of the light emitting zone of the light emitting unit. In addition, fluctuant changes of the cross section contour of the reflector vertical to the extension direction enable the local light intensity to be uniform, so as to improve the overall illumination quality of the light emitting unit. The column angle of the heat dissipation column of the light source device facing the reflector may also gradually change from the centre to the two ends of the reflector in parallel with the extension direction of the light source device, thereby further adjusting the light emitting uniformity of the light emitting unit. Therefore, the light emitting unit of an embodiment of the invention is easily manufactured and assembled, so that the manufacturing cost is saved, the volume is small, and the assembly is easy, thereby being applied to various backlight devices.

The foregoing description of the preferred embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to best explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to particularly preferred exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. The abstract of the disclosure is provided to comply with the rules requiring an abstract, which will allow a searcher to quickly ascertain the subject matter of the technical disclosure of any patent issued from this disclosure. It is submitted with the understanding that it will not be used to interpret or limit the scope or meaning of the claims. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A light emitting unit, comprising:
a light source device, extending in parallel with an extension direction, and capable of providing a light beam; and
a reflector, configured under the light source device and extending in parallel with the extension direction, wherein the reflector has a first protrusion and a pair of second protrusions located on two sides of the first protrusion, the first protrusion has a peak portion and two trough portions located on two sides of the peak portion, each of the second protrusions have a peak portion and a trough portion, and the two trough portions of the first protrusion are respectively connected to the trough portions of the two second protrusions to provide a fluctuant reflection surface, and the height of the cross section contours of each of the second protrusions in parallel with the extension direction is decreased in the entire section from a centre to two ends of the reflector.

2. The light emitting unit according to claim 1, wherein decreasing degrees of the pair of second protrusions are the same.

3. The light emitting unit according to claim 1, wherein a height of the peak portion of the first protrusion in parallel with the extension direction is deceased from the centre to the two ends of the reflector.

4. The light emitting unit according to claim 1, wherein the light source device comprises a heat dissipation column and a plurality of light emitting elements, the heat dissipation column extends along the extension direction, and the light emitting elements are configured on the heat dissipation column along the extension direction.

5. The light emitting unit according to claim 4, wherein the heat dissipation column is a polygonal column, and the light emitting elements are configured on a column surface of the polygonal column facing the reflector.

6. The light emitting unit according to claim 4, wherein the heat dissipation column is a polygonal column, and the light emitting elements are configured on two neighboring column surfaces of the polygonal column facing the reflector.

7. The light emitting unit according to claim 6, wherein an included angle of the two neighboring column surfaces is decreased in parallel with the extension direction from a centre to two ends of the polygonal column.

8. The light emitting unit according to claim 6, wherein the heat dissipation column is a quadrangular column with a kite cross section.

9. The light emitting unit according to claim 1, wherein the reflector further comprises at least one supporting wall, and at least two supporting walls are connected to the peak portion of the second protrusions and forms two side boundaries of a cross section contour of the reflector vertical to the extension direction.

10. The light emitting unit according to claim 9, wherein the reflector further comprises at least one hole located on the supporting wall and a fixing part, and the fixing part is configured in the hole.

11. The light emitting unit according to claim 9, wherein the light emitting unit further comprises a module supporting frame and a fixing part, the reflector further comprises an accommodation recess located on the supporting wall, the fixing part penetrates a perforation of the module supporting frame and the accommodation recess on the supporting wall, so as to fix the reflector in the module supporting frame.

12. The light emitting unit according to claim 11, wherein the light source device comprises a heat dissipation column and a plurality of light emitting elements, the module supporting frame comprises a first side wall, a second side wall opposite to the first side wall, a third side wall, and a fourth side wall opposite to the third side wall, the first side wall and the second side wall are in parallel with the extension direction, the third side wall and the fourth side wall are vertical to the extension direction and respectively comprise a supporting portion, wherein the heat dissipation column is fixed on the two supporting portions and suspends on the reflector.

13. The light emitting unit according to claim 1, wherein the reflection surface is formed by a plurality of plane surfaces connected to one another.

14. The light emitting unit according to claim 1, wherein the reflection surface is formed by a plurality of curved surfaces connected to one another.

15. The light emitting unit according to claim 1, wherein the light source device comprises a column and a plurality of light emitting elements, the column extends along the extension direction, the light emitting elements are configured on the peak portion of the first protrusion of the reflector along the extension direction, and the light emitting elements face a column surface of the column.

16. The light emitting unit according to claim 15, wherein the column is a polygonal column, and the light emitting elements face two neighboring column surfaces of the polygonal column.

* * * * *